(12) United States Patent
Chung et al.

(10) Patent No.: US 7,618,899 B2
(45) Date of Patent: Nov. 17, 2009

(54) METHOD OF PATTERNING A MATRIX INTO A SUBSTRATE VIA MULTIPLE, LINE-AND-SPACE, SACRIFICIAL, HARD MASK LAYERS

(75) Inventors: Seung-Pil Chung, Seoul (KR);
Dong-Chan Kim, Seoul (KR);
Chang-Jin Kang, Gyeonggi-do (KR);
Heung-Sik Park, Gyeonggi-do (KR)

(73) Assignee: Samsung Electroic Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/847,223

(22) Filed: Aug. 29, 2007

(65) Prior Publication Data

US 2008/0057733 A1     Mar. 6, 2008

(30) Foreign Application Priority Data

Aug. 29, 2006   (KR)   .................. 10-2006-0082473

(51) Int. Cl.
*H01L 21/31*     (2006.01)
*H01L 21/308*     (2006.01)

(52) U.S. Cl. .................. 438/760; 257/E21.24

(58) Field of Classification Search ............ 438/760; 257/E21.24
See application file for complete search history.

(56) References Cited

U.S. PATENT DOCUMENTS

| | | | | |
|---|---|---|---|---|
| 4,954,423 | A | * | 9/1990 | McMann et al. ............ 430/316 |
| 5,336,630 | A | | 8/1994 | Yun et al. |
| 5,700,732 | A | * | 12/1997 | Jost et al. ................. 438/401 |
| 5,936,274 | A | * | 8/1999 | Forbes et al. ............... 257/315 |
| 2007/0205443 | A1 | * | 9/2007 | Juengling ................... 257/288 |

FOREIGN PATENT DOCUMENTS

JP     2003-78000     3/2003

(Continued)

OTHER PUBLICATIONS

English language abstract of Korean Publication No. 1998-0069969.
English language abstract of Korean Publication No. 10-2007-0071104.

(Continued)

*Primary Examiner*—Matthew Smith
*Assistant Examiner*—Walter H Swanson
(74) *Attorney, Agent, or Firm*—Marger Johnson & McCollom, P.C.

(57) ABSTRACT

Methods of fabricating a semiconductor integrated circuit device are disclosed. The methods of fabricating a semiconductor integrated circuit device include forming a hard mask layer on a base layer, forming a line sacrificial hard mask layer on the hard mask layer in a first direction, coating a high molecular organic material layer on the line sacrificial hard mask layer pattern, patterning the high molecular organic material layer and the line sacrificial hard mask layer pattern in a second direction, forming a matrix sacrificial hard mask layer pattern, forming a hard mask layer pattern by patterning the hard mask layer with the matrix sacrificial hard mask layer pattern as an etching mask and forming a lower pattern by patterning the base layer using the hard mask layer pattern as an etch mask. The method according to the invention is simpler and less expensive than conventional methods.

28 Claims, 12 Drawing Sheets

FOREIGN PATENT DOCUMENTS

| | | |
|---|---|---|
| KR | 1991-0015055 | 8/1991 |
| KR | 1998-0011891 | 4/1998 |
| KR | 1998-0069969 | 10/1998 |
| KR | 2002-0046489 | 6/2002 |
| KR | 10-2007-0071104 | 7/2007 |

OTHER PUBLICATIONS

English language abstract of Korean Publication No. 1998-0011891.
English language abstract of Korean Publication No. 2002-0046489.
English language abstract of Japanese Publication No. 2003-78000.
English language abstract of Korean Publication No. 1991-0015055.

* cited by examiner

METHOD OF PATTERNING A MATRIX INTO A SUBSTRATE VIA MULTIPLE, LINE-AND-SPACE, SACRIFICIAL, HARD MASK LAYERS

CROSS REFERENCE TO RELATED APPLICATION

This application claims priority under 35 USC §119 to Korean Patent Application No. 10-2006-0082473, filed on Aug. 29, 2006 in the Korean Intellectual Property Office, the contents of which are incorporated herein by reference in their entirety.

BACKGROUND

1. Technical Field

The present invention relates to a method of fabricating a semiconductor integrated circuit device. More particularly, the present invention relates to a method of fabricating a semiconductor integrated circuit device that is simpler and less expensive than conventional methods.

2. Description of the Related Art

Due to the increasing demand for high density semiconductor devices, the design rule of semiconductor devices has been decreasing rapidly, and it has become crucial to form smaller patterns to meet the decreased design rule. However, due to the limited resolution of the stepper and scanner used in the photolithography process, it has been difficult to form small patterns, especially patterns smaller than 100 nm.

Many attempts have been made to manufacture vertical transistors in existing semiconductor fabrication processes to overcome transistor characteristic limitations and increase the number of dies formed in a wafer. To fabricate such a vertical transistor, it is necessary to form a round pillar pattern on the semiconductor substrate. However, it is difficult to make a pillar pattern having small design rules in a single attempt. Consequently, in order to achieve a pillar pattern, a line and space pattern is used in two steps to form the pillar pattern with small design rules. In other words, patterning is performed by creating a line and space in one direction, and the space is filled with an oxidation layer. Then another patterning is performed by creating a line and space pattern in the other direction, and a pillar pattern is formed by removing the oxidation layer.

However, in order to form a pillar pattern using the method explained above, the space is filled by an oxidation layer, and therefore a CMP (Chemical Mechanical Polishing) process, where an oxidation layer is deposited and the top of the oxidation layer is planarized, is required. Also, an etching process and a cleaning process are required to remove the oxidation layer that has been patterned. In order to prevent liftoff of an alignment key during LAL (HF and $NH_4F$) liftoff, an I-Line photo process is performed first, and then liftoff is performed after blocking an area to prevent liftoff of the alignment key.

Thus, the production cost is increased due to the complex fabrication process, the high-cost CMP process, and the additional photo process.

The present invention addresses these and other disadvantages of the conventional art.

SUMMARY

The present invention provides a method of fabricating a semiconductor integrated circuit device that is simpler and less expensive than conventional methods.

According to an aspect of the present invention, there is provided a method of fabricating a semiconductor integrated circuit device, the method including forming a hard mask layer on a base layer, forming a sacrificial hard mask layer on the hard mask layer, forming a line sacrificial hard mask layer pattern by patterning the sacrificial hard mask in the form of a line-and-space pattern such that it is in parallel with a first direction, planarizing upper surface of the line sacrificial hard mask layer pattern by coating a high molecular organic material layer on the line sacrificial hard mask layer pattern, patterning the high molecular organic material layer and the line sacrificial hard mask layer pattern in the form of a line-and-space pattern such that it is in a second direction, not parallel with the first direction, forming a matrix sacrificial hard mask layer pattern arranged in a matrix shape by removing the high molecular organic material pattern, forming a hard mask layer pattern arranged in a matrix shape by patterning the hard mask layer with the matrix sacrificial hard mask layer pattern as an etching mask and forming a lower pattern by patterning part of or the entire base layer using the hard mask layer pattern as an etch mask.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

As used herein, the term and/or includes any and all combinations of one or more of the associated listed items, and the terminology is to explain the exemplary embodiment. It should be understood that the above terminologies are not limiting. Unless specifically stated, a word in singular form also represents the plural form. The terms "comprise" and "comprising" used in the specification may include components, steps, operations and devices specifically mentioned in the specification, as well as other components, steps, and operations, and devices.

Hereinafter, a method of fabricating a semiconductor integrated circuit device will be described with reference to FIGS. 1 through 13. FIGS. 1 through 13 are perspective views illustrating a method of fabricating semiconductor integrated circuit device according to an exemplary embodiment of the present invention.

Figure 1:
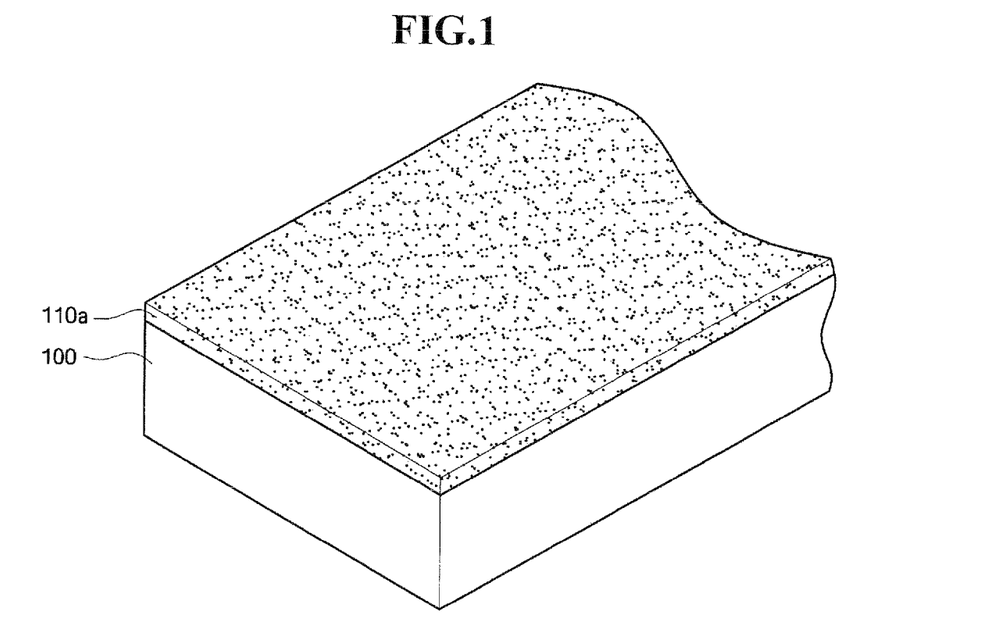
FIGS. 1 through 13 are perspective views illustrating a method of fabricating a semiconductor integrated circuit device according to an exemplary embodiment of the present invention and FIGS. 14 through 24 are perspective views illustrating a method of fabricating a semiconductor integrated circuit device according to another exemplary embodiment of the present invention.

Referring to FIG. 1, a hard mask layer 110a is formed on a base layer 100.

The base layer 100 will be etched at the end of the process and may be, for example, a semiconductor substrate, an inter-layer insulating layer, and others. The hard mask layer 110a is a material to facilitate etching of the base layer 100, and can have an etch selectivity to the base layer 100. For example, a silicon nitride layer or a poly-crystalline silicon layer can be used. Also, a pad oxide layer (not shown) may be formed between the hard mask layer 110a and the base layer 100.

Figure 2:
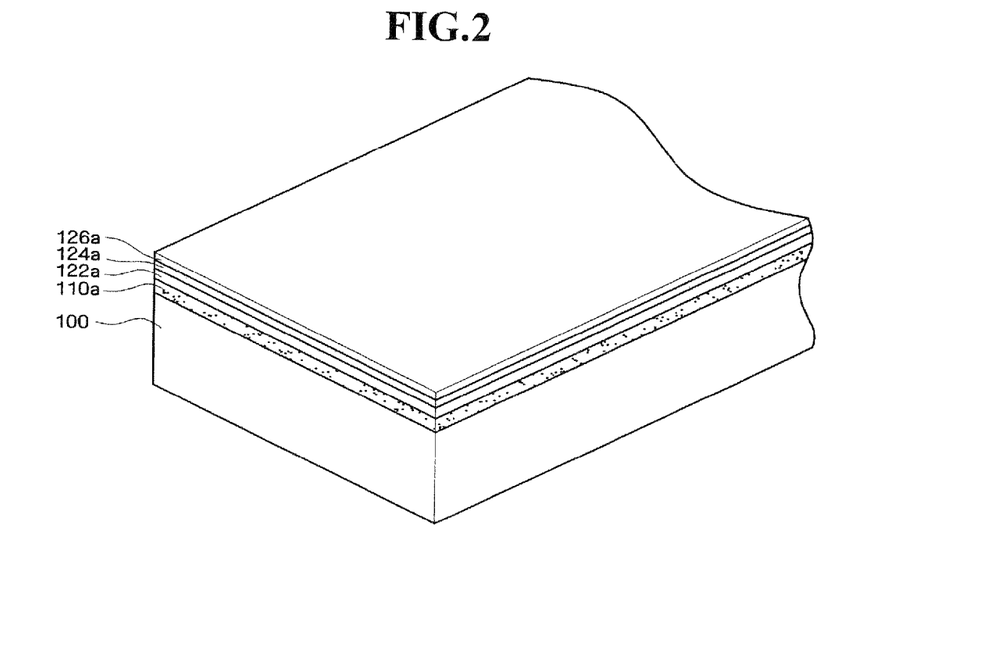

Referring to FIG. 2, a first sacrificial hard mask layer 122a, a second sacrificial layer 124a, and a third sacrificial layer 126a are sequentially formed on the hard mask layer 110a.

As the first sacrificial hard mask layer 122a has an etch rate that is smaller than an etch rate of the hard mask layer 110a, the first sacrificial hard mask layer 122a is used as an etch mask while the hard mask layer 110a is etched. The first sacrificial hard mask layer 122a can be amorphous carbon, which is formed by a coating method or a chemical vapor deposition (CVD) method. The second sacrificial hard mask layer 124a prevents the first sacrificial hard mask layer 122a from being damaged while the third sacrificial hard mask layer 126a, formed on the second sacrificial hard mask layer 124a, is patterned. A stackable layer at 400° C. or less can be used as the second sacrificial layer 124a. The second sacrificial layer 124a can be silicon oxide such as ALD oxide, PETEOS, PE-oxide, and others.

The third sacrificial hard mask layer 126a is used to pattern the second sacrificial hard mask layer 124a, and has an etch selectivity with respect to the second sacrificial hard mask layer 124a. In other words, when the second sacrificial hard mask layer 124a comprises silicon oxide, the third sacrificial hard mask layer 126a has an etch selectivity with respect to silicon oxide. The third sacrificial hard mask layer 126a can be made of, for example, a SiN series compound such as PE-SiN, SiON, and others.

According to some embodiments, the first sacrificial hard mask layer 122a, the second sacrificial hard mask layer 124a and the third sacrificial hard mask layer 126a can be respectively amorphous carbon; a SiN series compound such as PE-SiN, SiON, and others; and silicon oxide such as ALD oxide, PETEOS, PE-oxide, and others.

Figure 3:
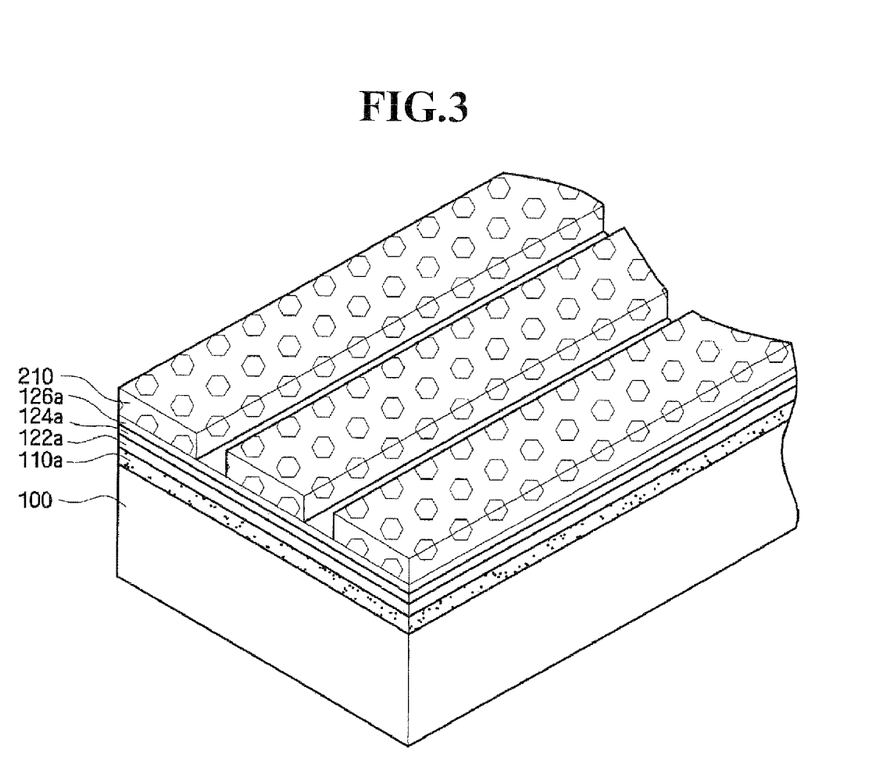

Referring to FIG. 3, a line-and-space-shaped first photoresist pattern 210 is formed on the third sacrificial hard mask layer 126a.

After a photoresist is applied to the top of the third sacrificial hard mask layer 126a, the line-and-space-shaped first photoresist pattern 210, which is parallel to a first direction, is formed with a line-and-space-shaped mask. Specifically, a line-and-space pattern includes a plurality of lines with spaces defined therebetween.

Figure 4:
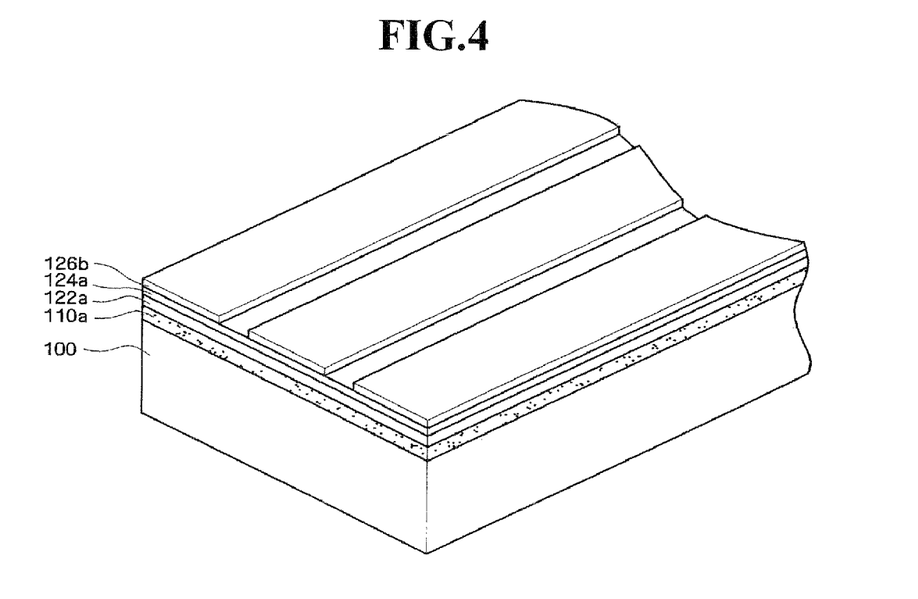

Referring to FIG. 4, the line third hard mask layer pattern 126b is formed by patterning the third sacrificial hard mask layer 126a of FIG. 3 with the first photoresist pattern 210 as an etch mask.

That is, the third sacrificial hard mask layer 126a is patterned with the line-and-space-shaped first photoresist pattern 210 which is parallel to the first direction, so the line third sacrificial hard mask layer pattern 126b, which is line-shaped and parallel to the first direction, is formed. Then, the first photoresist pattern 210 on the line third sacrificial hard mask layer pattern 126b is removed by an ashing and strip process.

Figure 5:
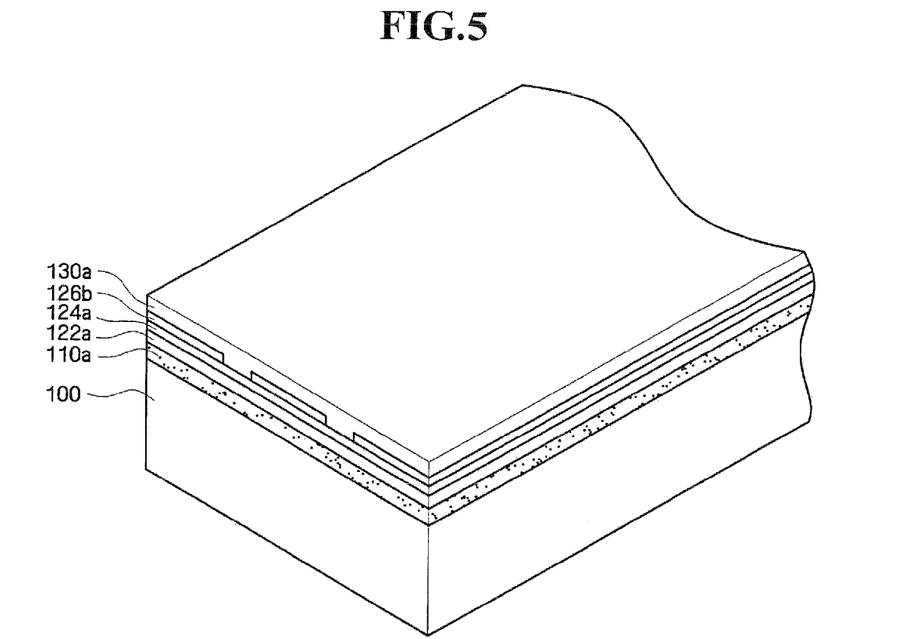

Referring to FIG. 5, a high molecular organic material layer 130a is coated on the third line sacrificial hard mask layer pattern 126b.

The high molecular organic material layer 130a is a flow-type material, for example, an ARC (anti-reflective coating) or a photoresist (PR). If the high molecular organic material layer 130a is photoresist, the high molecular organic material layer 130a can be a bi-layer or tri-layer.

The high molecular organic material layer 130a is coated by spin coating. Because the high molecular organic material layer 130a is higher than the line third sacrificial hard mask layer pattern 126b, the top of the high molecular organic material layer 130a can be planarized by the spin coating process.

If the space region of the line third sacrificial hard mask layer pattern 126b were to be filled with an oxidation layer, an additional planarization process such as CMP must be performed in order to planarize the top. But when the line third sacrificial hard mask layer pattern 126b is coated with the high molecular organic material layer 130a, the top is planarized during spin coating. Therefore the CMP process is not needed, so the fabrication process can be simplified. Also, the expensive CMP process is omitted, so the fabrication cost can be reduced.

Figure 6:
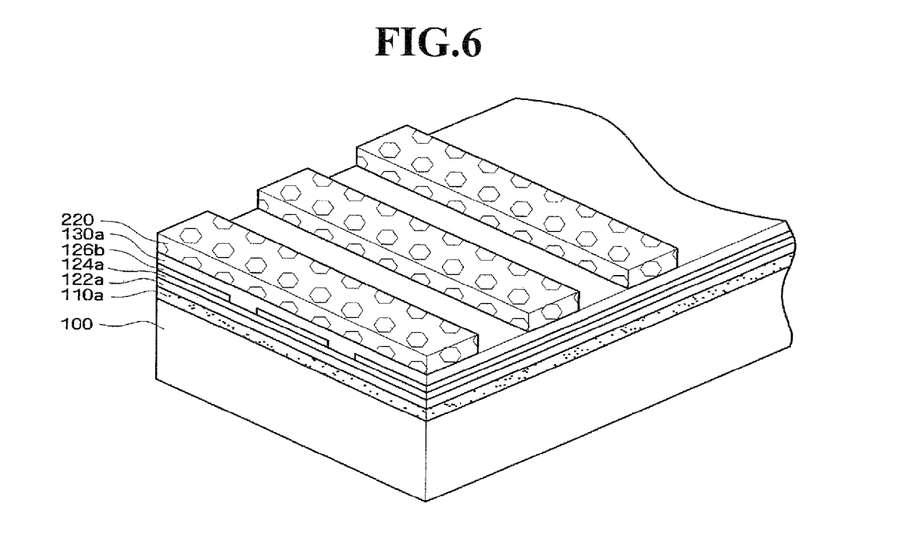

Referring to FIG. 6, a line-and-space-shaped second photoresist pattern 220 is formed on the high molecular organic material layer 130a.

After the photoresist is applied to the high molecular organic material layer 130a, the line-and-space-shaped second photoresist pattern 220, which is not parallel to the first direction, but parallel to a second direction, is formed with a line-and-space-shaped mask.

Figure 7:
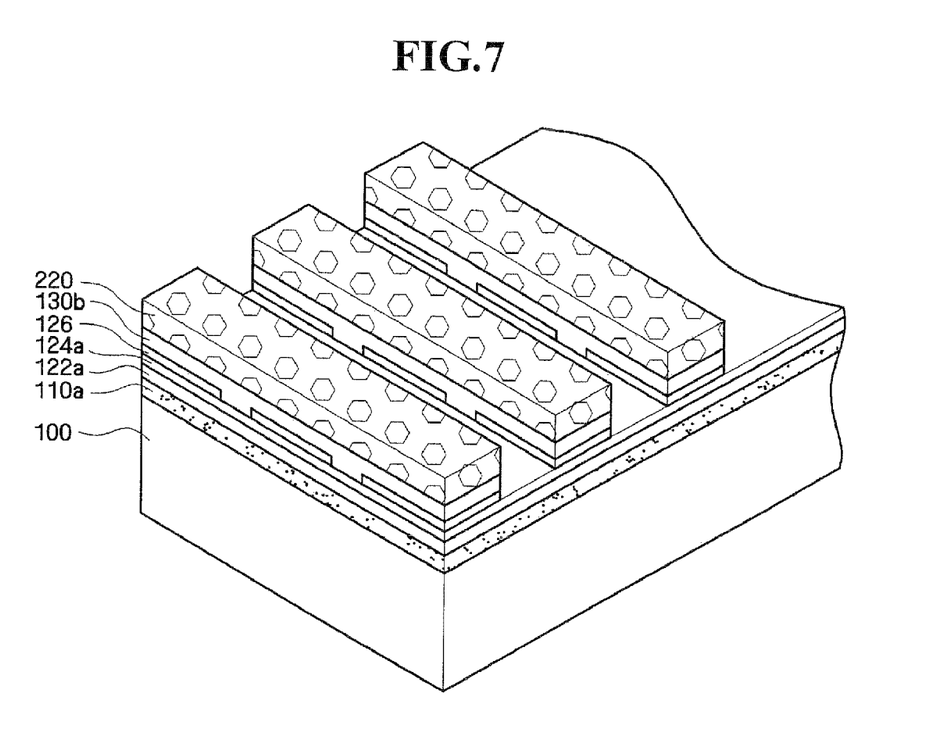

The first direction and the second direction are not parallel, but have a predetermined angle between them of between 0 and 90 degrees. FIG. 7 shows the case where the angle of the first direction is substantially orthogonal to the second direction.

Referring to FIG. 7, the high molecular organic material layer 130a of FIG. 6 and the line third sacrificial hard mask layer pattern 126b of FIG. 6 are patterned with the second photoresist pattern 220 as an etch mask.

That is, the high molecular organic material layer 130a and the line third sacrificial hard mask layer pattern 126b are patterned with the line-and-space-shaped second photoresist pattern 220, which is parallel to the second direction, so the high molecular organic material pattern 130b is formed to have a line-and-space pattern parallel to the second direction. At this time, the line third sacrificial hard mask layer pattern 126b is etched to the bottom of the line third sacrificial hard mask layer pattern 126b to form a matrix third sacrificial hard mask layer pattern 126.

Figure 8:
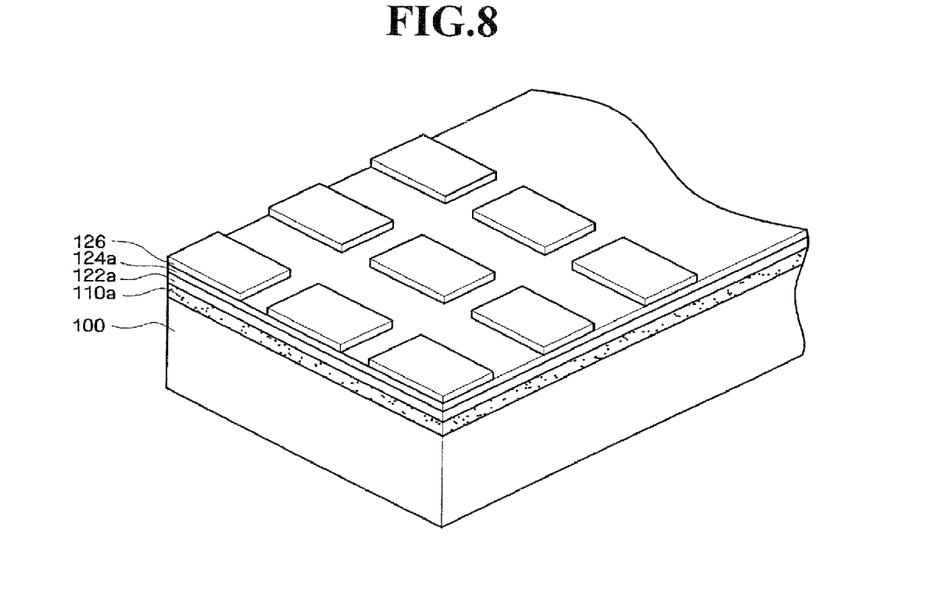

Referring to FIG. 8, the high molecular organic material pattern 130b of FIG. 7 is removed to expose the matrix third sacrificial hard mask layer pattern 126, which is arranged in a matrix shape.

Since the composition material of the high molecular organic material pattern 130b is similar to the composition material of the second photoresist pattern 220 of FIG. 7, the high molecular organic material pattern 130b can be removed while the second photoresist pattern 220 is removed. That is, the second photoresist pattern 220 and the high molecular organic material pattern 130b can be removed at the same time.

If the second photoresist pattern 220 and the high molecular organic material pattern 130b are removed at the same time, since an additional removal process or cleaning process is not needed, the fabrication process can be simplified and the productivity of the fabrication process can be increased.

Figure 9:
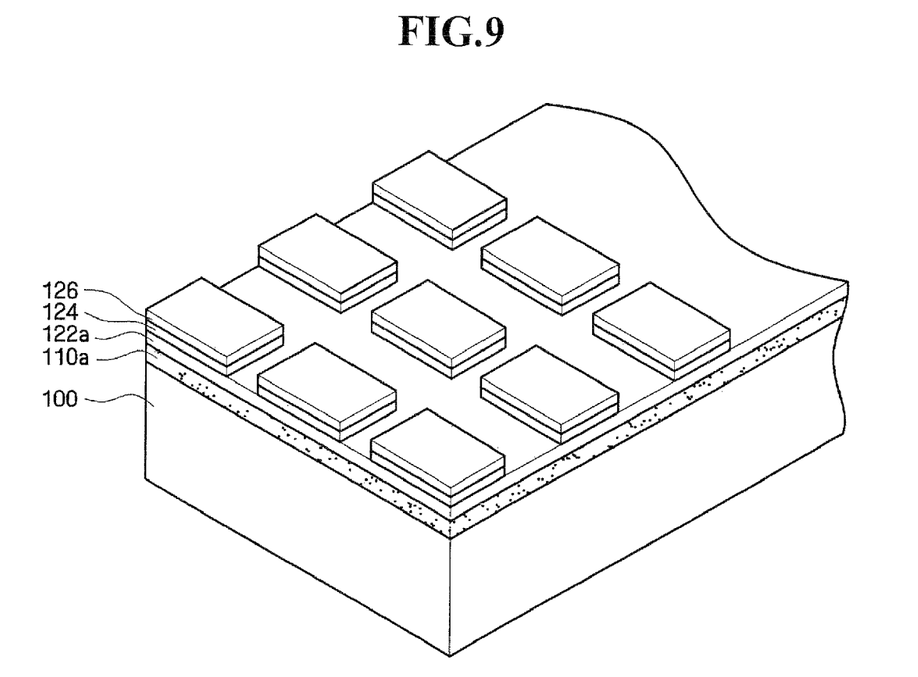

Referring to FIG. 9, a matrix second sacrificial hard mask layer pattern 124 is formed by patterning the second sacrificial hard mask layer 124a of FIG. 8 with the matrix third sacrificial hard mask layer pattern 126 as an etch mask.

An etch gas which can etch the second sacrificial hard mask layer 124a more quickly than the matrix third sacrificial hard mask layer pattern 126 is used while the second sacrificial hard mask layer 124a is patterned with the matrix third sacrificial hard mask layer pattern 126 as the etch mask. For example, the etch gas can include carbon and fluorine series gas. That is, since the etch rate of the matrix third sacrificial hard mask layer pattern 126 is minimized during patterning of the second sacrificial hard mask layer 124a, the matrix third sacrificial hard mask layer pattern 126 can be used continuously as the etch mask after this step.

Figure 10:
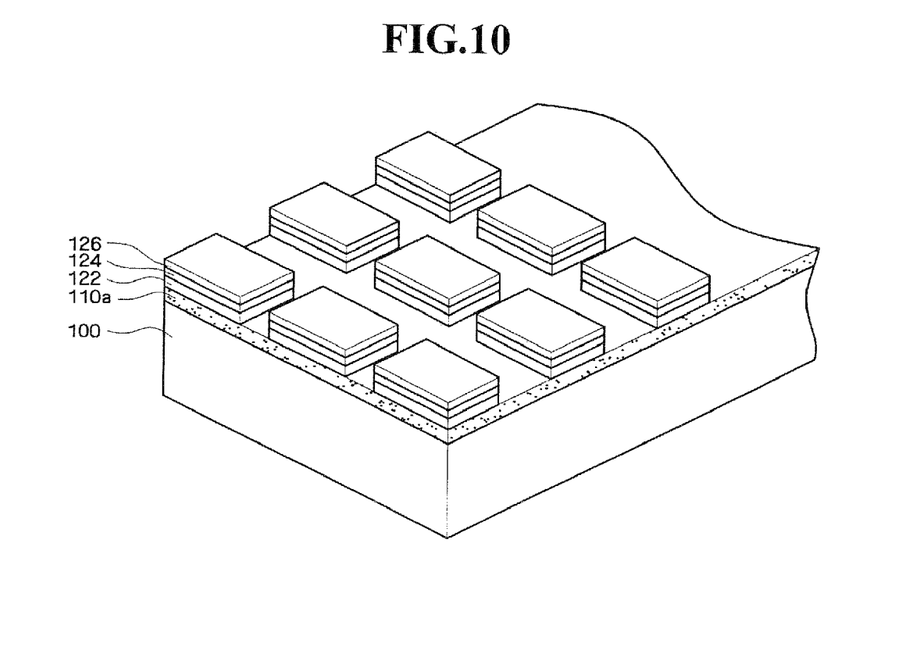

Referring to FIG. 10, a matrix first sacrificial hard mask layer pattern 122 is formed by patterning the first sacrificial hard mask layer 122a of FIG. 9 using the matrix second sacrificial hard mask layer pattern 124 as the etch mask.

If a part of the matrix third sacrificial hard mask layer pattern 126, used as the etch mask for the formation of the matrix second sacrificial hard mask layer pattern 124, remains, the matrix third sacrificial hard mask layer pattern 126 can be used as the etch mask for patterning the first sacrificial hard mask layer 122a along with the matrix second sacrificial hard mask layer pattern 124. In other words, even if the matrix third sacrificial hard mask layer pattern 126 is partially removed during formation of the matrix second sacrificial hard mask layer pattern 124, the matrix second sacrificial hard mask layer pattern 124 can still be used as an etch mask during formation of the matrix first sacrificial hard mask layer pattern 122, thereby ensuring the proper dimensions of the matrix first sacrificial hard mask layer pattern 122.

An etch gas which can etch the first sacrificial hard mask layer 122a more than the matrix second sacrificial hard mask layer pattern 124 is used while the first sacrificial hard mask layer 122a is patterned using the matrix second sacrificial hard mask layer pattern 124 as the etch mask. The etch gas can include, for example, $O_2$ gas. That is, since the etch rate of the matrix second sacrificial hard mask layer pattern 124 is minimized during patterning of the first sacrificial hard mask layer 122a, the matrix second sacrificial hard mask layer pattern 124 can be used continuously as the etch mask after this step.

Figure 11:
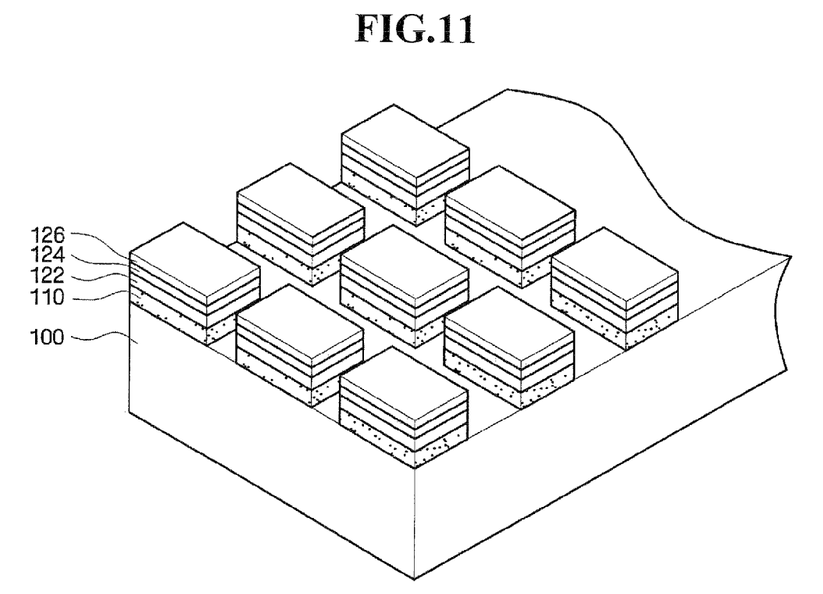

Referring to FIG. 11, a hard mask layer pattern 110, which is arranged in a matrix shape, is formed by patterning the hard mask layer 110a of FIG. 10 with the matrix first sacrificial hard mask layer pattern 122 as the etch mask.

If a part of the matrix third sacrificial hard mask layer pattern 126 and the matrix second sacrificial hard mask layer pattern 124 remain, the matrix third sacrificial hard mask layer pattern 126 and the matrix second sacrificial hard mask layer pattern 124 can be used as the etch mask for patterning the hard mask layer 110a along with the matrix first sacrificial hard mask layer pattern 122.

Figure 12:
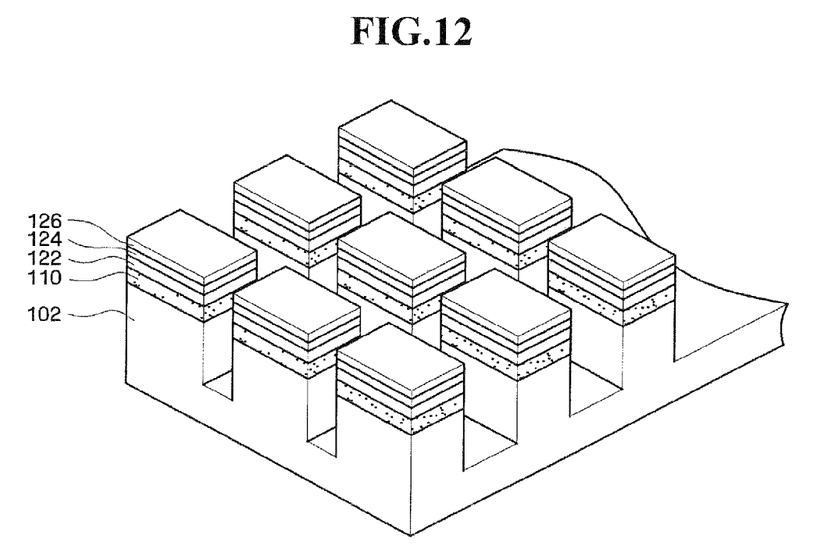

Referring to FIG. 12, a lower pattern 102 is formed by patterning part of, or the entire, base layer 100 of FIG. 11 using the hard mask layer pattern 110 as the etch mask.

If a part of the matrix third sacrificial hard mask layer pattern 126, the matrix second sacrificial hard mask layer pattern 124, and the matrix first sacrificial hard mask layer pattern 122 remain, the matrix third sacrificial hard mask layer pattern 126, the matrix second sacrificial hard mask layer pattern 124, and the matrix first sacrificial hard mask layer pattern 122 can be used as the etch mask for patterning the base layer 100 along with the hard mask layer pattern 110.

Figure 13:
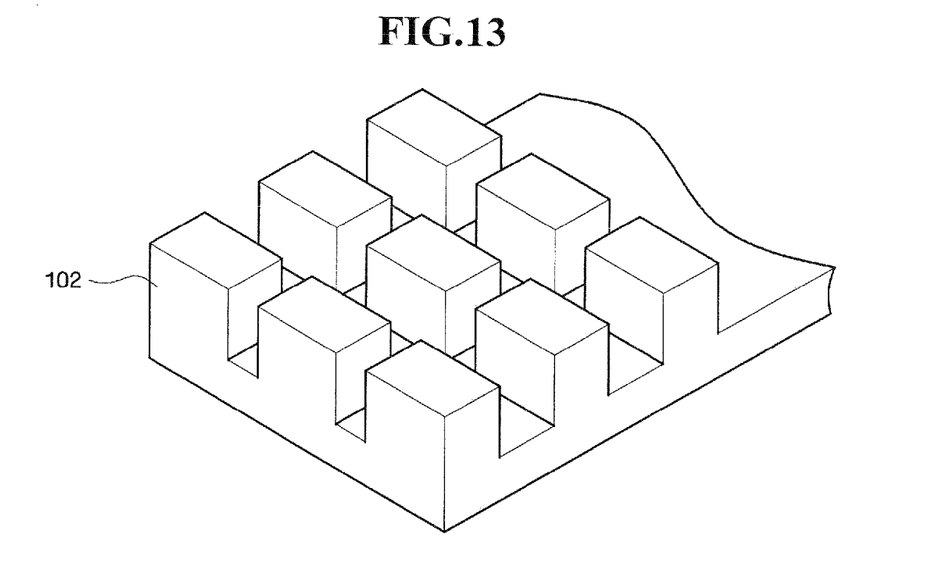

Referring to FIG. 13, the hard mask layer pattern 110 of FIG. 12 on the lower pattern 102 is removed.

That is, the lower pattern 102 is completed by removing the hard mask layer pattern 110 on the lower pattern 102. At the same time, the matrix first sacrificial hard mask layer pattern 122, the matrix second sacrificial hard mask layer pattern 124, and the matrix third sacrificial hard mask layer pattern 126 of FIG. 12 that remain on the hard mask layer pattern 110 are also removed.

If the base layer 100 is a semiconductor substrate, part of the semiconductor substrate is patterned, so a pillar can be formed. In this case, a vertical transistor can be completed by forming a drain region, a gate electrode, and a source region.

According to the method of fabricating a semiconductor integrated circuit device having a pattern with a small design rule, the line-and-space pattern can be used twice to obtain an accurate pattern, where it cannot be patterned with one step due to its small design rule.

According to the method, the line-and-space pattern process can be simplified, so productivity can be increased. Specifically, since the line third sacrificial hard mask layer pattern 126b is coated with the high molecular organic material layer 130a, the high molecular organic material layer 130a is planarized at the same time. So an additional CMP process is not needed and the fabrication process can be simplified. Also, since the high molecular organic material pattern 130b is removed with the second photoresist pattern 220, an additional removing process or cleaning process is not needed, so the fabricating process can be further simplified.

Hereinafter, another exemplary embodiment of a method of fabricating a semiconductor integrated circuit device will be described with reference to FIGS. 14 through 24. FIGS. 14 through 24 are perspective views illustrating a method of fabricating a semiconductor integrated circuit device according to another exemplary embodiment of the present invention.

The same reference numerals are used for identical components in FIGS. 1 through 13, and detailed descriptions of the corresponding components are omitted.

The method of fabricating a semiconductor integrated circuit device according to another exemplary embodiment of the present invention is the same as the first exemplary embodiment of the present invention except that a monolayer of a sacrificial hard mask layer is formed on a hard mask layer. The number of monolayers of the sacrificial hard mask layer can be adjusted according to the height of a base layer. If the base layer is not high, the hard mask layer can be patterned with a single monolayer of the sacrificial hard mask layer. The exemplary embodiment described below uses a sacrificial hard mask layer including a single monolayer.

Figure 14:
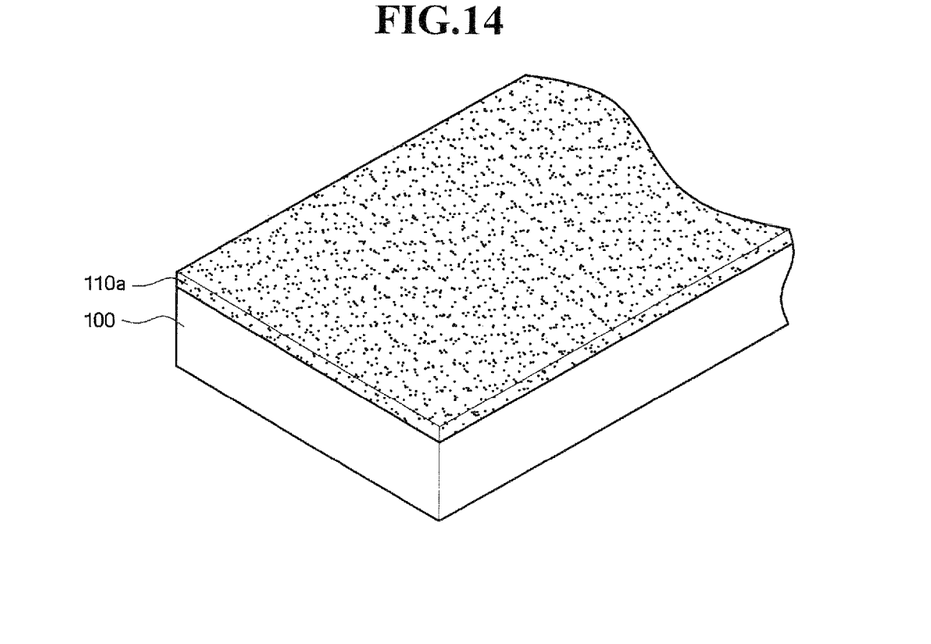

Referring to FIG. 14, a hard mask layer 110a is formed on a base layer 100.

The base layer 100 is a layer which will be etched at the end of the process and may be, for example, a semiconductor substrate, an interlayer sacrificial hard mask layer, and others. The hard mask layer 110a is a material to facilitate etching of the base layer 100 and may be, for example, a SiN layer. Also, a pad oxide layer (not shown) can be formed between the hard mask layer 110a and the base layer 100.

Figure 15:
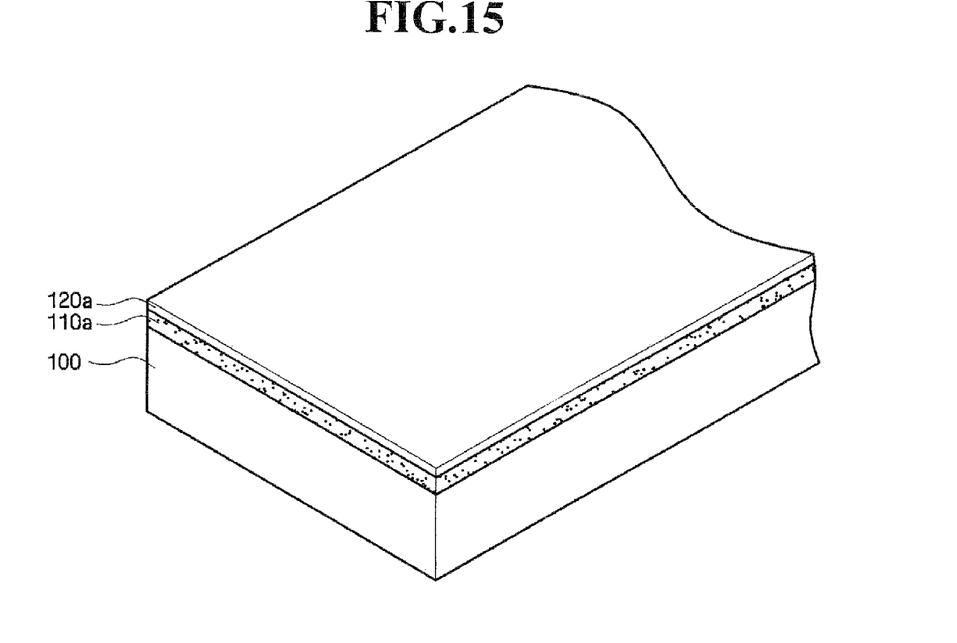

Referring to FIG. 15, a sacrificial hard mask layer 120a is formed on the hard mask layer 110a.

As the sacrificial hard mask layer 120a has an etch rate that is smaller than an etch rate of the hard mask layer 110a, the sacrificial hard mask layer 120a is used as an etch mask while the hard mask layer 110a is etched. The material of the sacrificial hard mask layer 120a has a high etch selectivity to silicon oxide, for example, a SiN series such as PE-SiN, SiON.

Figure 16:
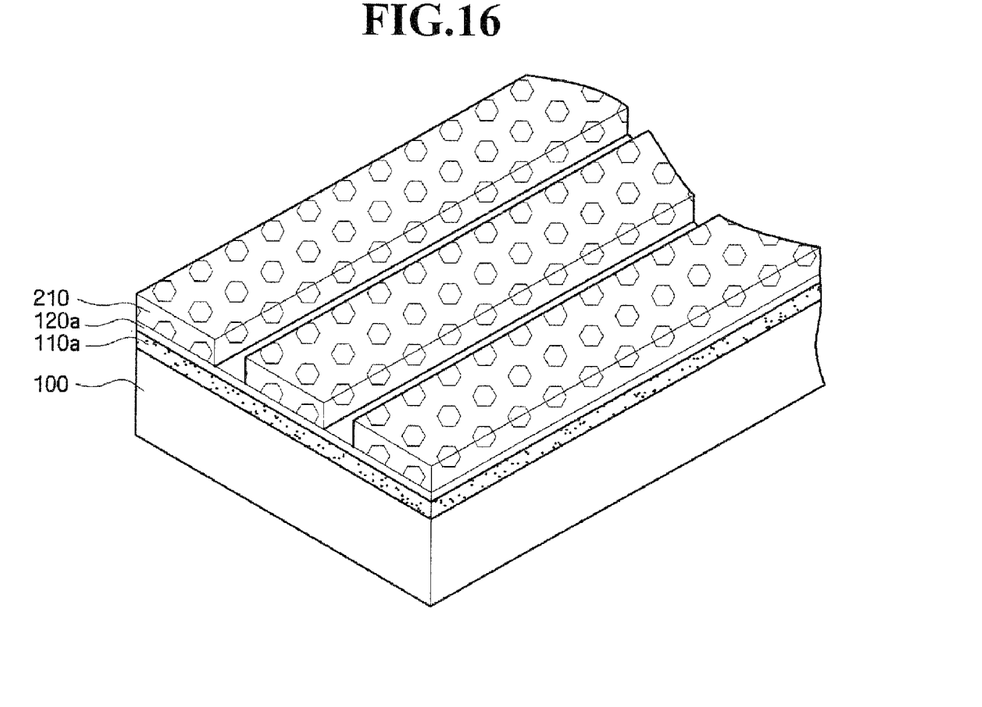

Referring to FIG. 16, a line-and-space-shaped first photoresist pattern 210 is formed on the sacrificial hard mask layer 120a.

After photoresist is applied to the top of the sacrificial hard mask layer 120a, the first photoresist pattern 210, which is line-and-space-shaped and parallel to a first direction, is formed with a line-and-space-shaped mask.

Figure 17:
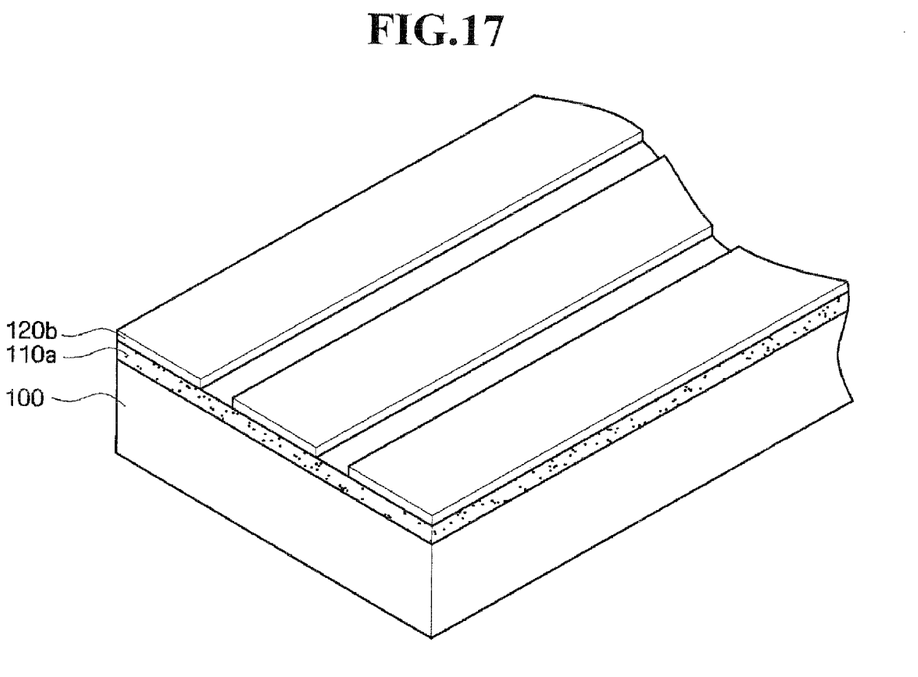

Referring to FIG. 17, a line sacrificial hard mask layer pattern 120b is formed by patterning the sacrificial hard mask layer 120a of FIG. 16 with the first photoresist pattern 210 as an etch mask.

That is, the sacrificial hard mask layer 120a is patterned with the line-and-space-shaped first photoresist pattern 210 which is parallel to the first direction, so that the line sacrificial hard mask layer pattern 120b, which is parallel to the first direction, is formed. Then, the first photoresist pattern 210 on the line sacrificial hard mask layer pattern 120b is removed by an ashing and strip process.

Figure 18:
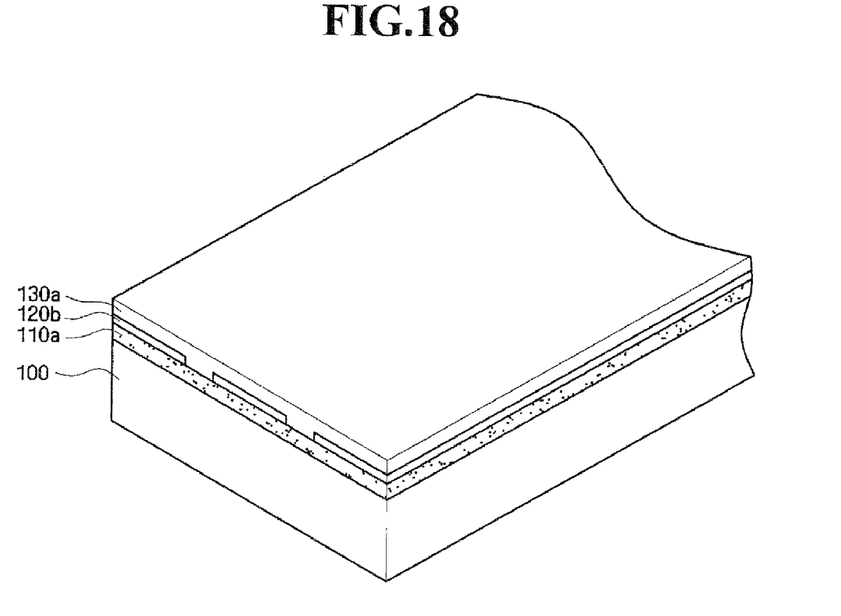

Referring to FIG. 18, a high molecular organic material layer 130a is coated on the line sacrificial hard mask layer pattern 120b.

The high molecular organic material layer 130a is a flow type material, for example, ARC (anti-reflective coating) or photoresist (PR). If the high molecular organic material layer 130a is photoresist, the high molecular organic material layer 130a can be a bi-layer or tri-layer.

The high molecular organic material layer 130a is coated by spin coating. Because the high molecular organic material layer 130a is higher than the line sacrificial hard mask layer pattern 120b, the top of the high molecular organic material layer 130a can be planarized by the spin coating process.

If the space region of the line sacrificial hard mask layer pattern 120b were to be filled with an oxidation layer, an additional planarization process such as CMP must be performed in order to planarize the top. But if the line sacrificial hard mask layer pattern 120b is coated with the high molecular organic material layer 130a, the top is planarized during spin coating. Therefore, a CMP process is not needed, so the fabrication process can be simplified. Also, the expensive CMP process is omitted, so the fabrication cost can be reduced.

Figure 19:
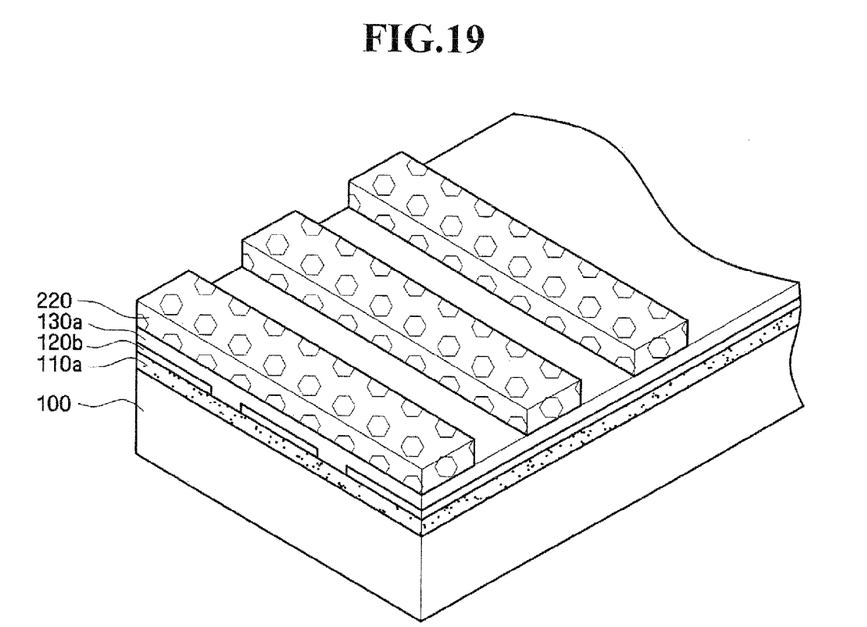

Referring to FIG. 19, a line-and-space-shaped second photoresist pattern 220 is formed on the high molecular organic material layer 130a.

After photoresist is applied to the high molecular organic material layer 130a, the line-and-space-shaped second photoresist pattern 220, which is not parallel to the first direction, but parallel to a second direction, is formed with a line-and-space-shaped mask.

The first direction and the second direction are not parallel to each other, and have a predetermined angle. The angle between the first direction and the second direction can be between 0 and 90 degrees. FIG. 19 shows the case where the angle of the first direction is substantially orthogonal to the second direction.

Figure 20:
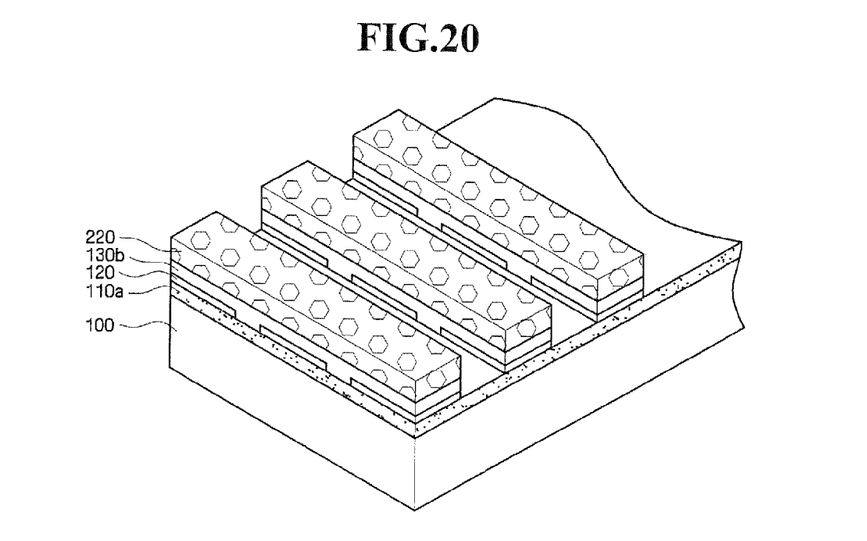

Referring to FIG. 20, the high molecular organic material layer 130a and 120b are patterned with the second photoresist pattern 220 as an etch mask.

That is, the high molecular organic material layer 130a and the line sacrificial hard mask layer pattern 120b are patterned with the line-and-space-shaped second photoresist pattern 220 which is parallel to the second direction. Thereby, the high molecular organic material pattern 130b, having a line-and-space pattern in the second direction, is formed. At this time, the line sacrificial hard mask layer pattern 120b is etched to the bottom of the line sacrificial hard mask layer pattern 120b to form a matrix sacrificial hard mask layer pattern 120.

Figure 21:
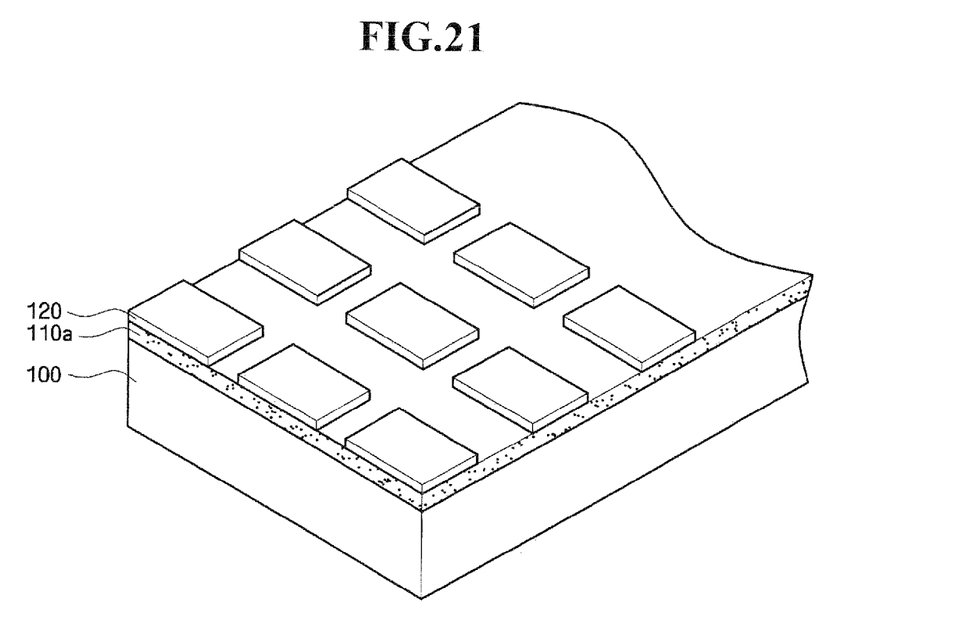

Referring to FIG. 21, the high molecular organic material pattern 130b of FIG. 20 is removed to expose the matrix sacrificial hard mask layer pattern 120, arranged in a matrix shape.

Since the composition material of the high molecular organic material pattern 130b is similar to the composition material of the second photoresist pattern 220 of FIG. 20, the high molecular organic material pattern 130b can be removed while the second photoresist pattern 220 is removed. That is, the second photoresist pattern 220 and the high molecular organic material pattern 130b can be removed at the same time.

Since the second photoresist pattern 220 and the high molecular organic material pattern 130b are removed at the same time, an additional removal process or cleaning process is not needed, so the fabrication process can be simplified and the productivity of the fabrication process can be increased.

Figure 22:
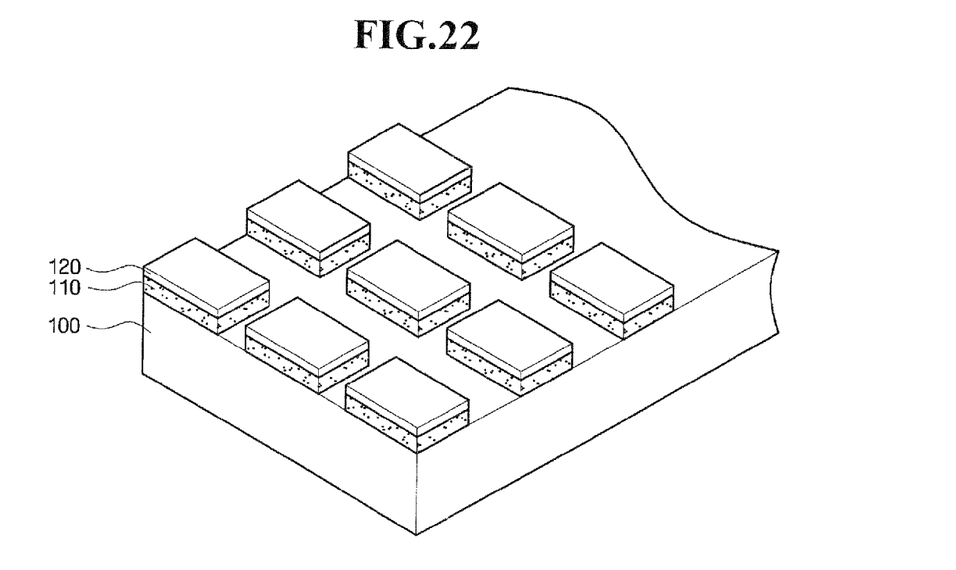

Referring to FIG. 22, a hard mask layer pattern 110 which is arranged in a matrix shape is formed by patterning the hard mask layer 110a of FIG. 21 with the matrix sacrificial hard mask layer pattern 120 as the etch mask.

Figure 23:
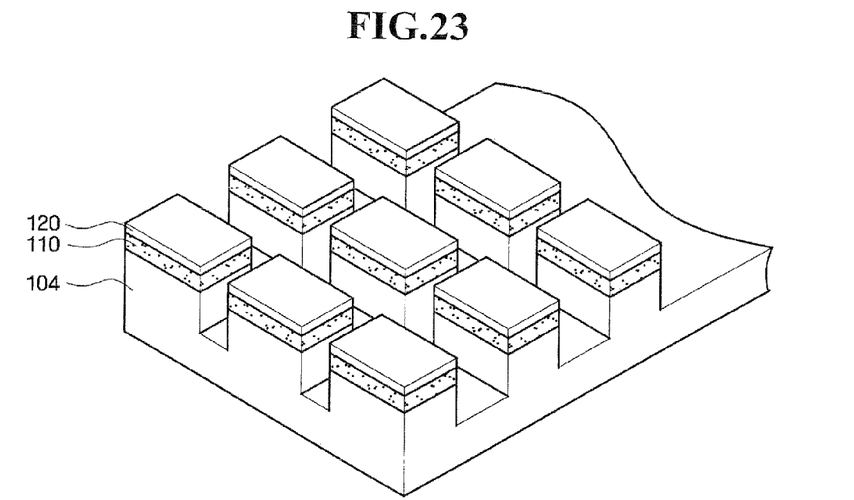

Referring to FIG. 23, a lower pattern 104 is formed by patterning a part of or the whole base layer 100 of FIG. 22 with the hard mask layer pattern 110 as the etch mask.

Figure 24:
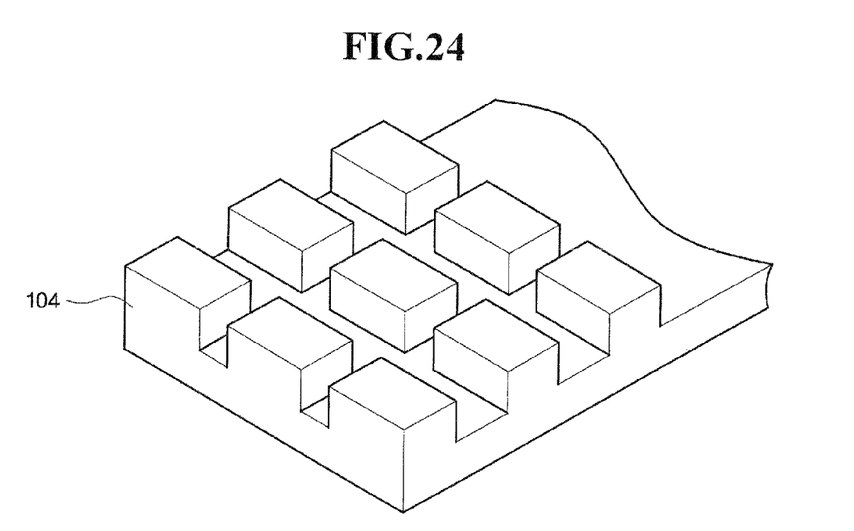

Referring to FIG. 24, the hard mask layer pattern 110 of FIG. 23 on the lower pattern 104 is removed.

That is, the lower pattern 104 is completed by removing the hard mask layer pattern 110 on the lower pattern 104. At the same time, the bard mask layer pattern 110 of FIG. 23 that remains on the lower pattern 104 is also removed.

If the base layer 100 is a semiconductor substrate, part of the semiconductor substrate is patterned, so a pillar can be formed. In this case, a vertical transistor can be completed by forming a drain region, a gate electrode, and a source region.

As described above, according to the method of fabricating a semiconductor integrated circuit device of the present invention, one or more of the following effects can be observed.

First, the line-and-space pattern can be used twice to obtain an accurate pattern, as the semiconductor integrated circuit device cannot be patterned at one time due to its small design rule. Second, the fabricating process can be simplified, and the productivity can be increased due to the subsequent decrease in cost.

The foregoing is illustrative of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the following claims.

What is claimed is:

1. A method of fabricating a semiconductor integrated circuit device, the method comprising:

forming a hard mask layer on a base layer;

forming a sacrificial hard mask layer on the hard mask layer;

forming a line sacrificial hard mask layer pattern by patterning the sacrificial hard mask layer, wherein the line sacrificial hard mask layer comprises a plurality of lines parallel to a first direction having spaces defined therebetween;

planarizing an upper surface of the line sacrificial hard mask layer pattern by coating a high molecular organic material layer on the line sacrificial hard mask layer pattern;

patterning the high molecular organic material layer and the line sacrificial hard mask layer pattern in the form of a plurality of lines parallel to a second direction having spaces defined therebetween, the second direction not parallel to the first direction;

forming a matrix sacrificial hard mask layer pattern arranged in a matrix shape by removing the high molecular organic material pattern;

forming a hard mask layer pattern arranged in a matrix shape by patterning the hard mask layer with the matrix sacrificial hard mask layer pattern as an etching mask; and forming a lower pattern by patterning the base layer using the hard mask layer pattern as an etch mask.

2. The method of claim 1, wherein the base layer is a semiconductor substrate, and the lower pattern is a pillar pattern.

3. The method of claim 2, further comprising forming a vertical transistor on the semiconductor substrate upon which the pillar pattern is formed.

4. The method of claim 1, wherein the hard mask layer is a silicon nitride layer or a poly-crystalline silicon layer.

5. The method of claim 1, wherein the high molecular organic material layer is formed by a spin-coating method.

6. The method of claim 1, wherein a planarized height of the high molecular organic material layer is higher than that of the sacrificial hard mask layer pattern.

7. The method of claim 1, wherein the high molecular organic material layer is an organic anti-reflective coating (ARC).

8. The method of claim 1, wherein the high molecular organic material layer is photoresist.

9. The method of claim 8, wherein the photoresist is a bi-layer or tri-layer.

10. The method of claim 1, wherein the sacrificial hard mask layer has an etch rate that is smaller than an etch rate of the hard mask layer.

11. The method of claim 10, wherein the sacrificial hard mask layer is PE-SiN or SiON.

12. The method of claim 1, wherein the sacrificial hard mask layer comprises sequentially stacking a first sacrificial hard mask layer, a second sacrificial hard mask layer, and a third sacrificial hard mask layer, and forming the matrix sacrificial hard mask layer pattern involves forming the matrix third sacrificial hard mask layer pattern by patterning only the third sacrificial hard mask layer.

13. The method of claim 12, wherein forming the hard mask layer pattern after the matrix third sacrificial hard mask layer pattern comprises:

forming a matrix second sacrificial hard mask layer pattern by patterning the second sacrificial hard mask layer using the matrix third sacrificial hard mask layer pattern as an etch mask, forming a matrix first sacrificial hard mask layer pattern by patterning the first sacrificial hard mask layer using the matrix second sacrificial hard mask layer pattern as an etch mask, and forming the hard mask layer pattern by patterning the hard mask layer using the matrix first sacrificial hard mask layer pattern as an etch mask.

14. The method of claim 13, wherein the second sacrificial hard mask layer prevents the first sacrificial hard mask layer from being damaged while the third sacrificial hard mask layer pattern is formed.

15. The method of claim 14, wherein the third sacrificial hard mask layer is PE-SiN or SiON.

16. The method of claim 15, wherein the second sacrificial hard mask layer is silicon oxide.

17. The method of claim 16, wherein patterning the second sacrificial hard mask layer using the matrix third sacrificial hard mask layer pattern as the etch mask includes using an etch gas having an etch rate with the second sacrificial hard mask layer that is higher than the etch rate of the matrix third sacrificial hard mask layer pattern.

18. The method of claim 17, wherein the etch gas comprises carbon and fluorine.

19. The method of claim 17, wherein the second sacrificial hard mask layer is ALD oxide, PETEOS, or PE-oxide.

20. The method of claim 16, wherein patterning the first sacrificial hard mask layer using the matrix second sacrificial hard mask layer pattern as the etch mask includes using an etch gas having an etch rate with the first sacrificial hard mask layer that is larger than the etch rate of the matrix second sacrificial hard mask layer pattern.

21. The method of claim 20, wherein the first sacrificial hard mask layer is amorphous carbon.

22. The method of claim 21, wherein the etch gas comprises $O_2$.

23. The method of claim 13, wherein the first sacrificial hard mask layer has an etch rate that is smaller than an etch rate of the hard mask layer.

24. The method of claim 23, wherein the first sacrificial hard mask layer is amorphous carbon.

25. The method of claim 12, wherein the third sacrificial hard mask layer is silicon oxide.

26. The method of claim 25, wherein the second sacrificial hard mask layer is PE-SiN or SiON.

27. The method of claim 1, further comprising forming a pad oxide layer between the hard mask layer and the base layer.

28. The method of claim 1, wherein the first direction is substantially orthogonal to the second direction.

* * * * *

UNITED STATES PATENT AND TRADEMARK OFFICE
CERTIFICATE OF CORRECTION

PATENT NO.         : 7,618,899 B2
APPLICATION NO.    : 11/847223
DATED              : November 17, 2009
INVENTOR(S)        : Seung-Pil Chung et al.

It is certified that error appears in the above-identified patent and that said Letters Patent is hereby corrected as shown below:

Column 8, line 29, the word "bard" should read --hard--.

Signed and Sealed this

Sixth Day of July, 2010

David J. Kappos
*Director of the United States Patent and Trademark Office*